United States Patent [19]

Martin et al.

[11] 4,196,009

[45] Apr. 1, 1980

[54] COLOR IMAGING DEVICES HAVING INTEGRAL COLOR FILTER ARRAYS

[75] Inventors: Thomas W. Martin, Rochester; M. Akram Sandhu, Webster, both of N.Y.

[73] Assignee: Eastman Kodak Company, Rochester, N.Y.

[21] Appl. No.: 884,514

[22] Filed: Mar. 8, 1978

[51] Int. Cl.$^2$ .......................... G03F 5/00; G02B 5/18; G02B 5/22

[52] U.S. Cl. ........................ 430/7; 313/371; 313/374; 350/162 SF; 350/311; 350/317; 358/41; 358/44; 358/253; 430/24; 430/321; 430/541

[58] Field of Search ................... 96/35, 36, 38.2, 117, 96/118, 36.1, 77; 313/65–68, 36, 371–374; 350/166, 162 SF, 317, 311; 427/248 H; 358/41, 44, 205, 253

[56] References Cited

U.S. PATENT DOCUMENTS

| | | | |
|---|---|---|---|
| 2,681,857 | 6/1954 | Rogers | 96/118 |
| 2,750,524 | 6/1956 | Braham | 96/116 |
| 3,632,291 | 1/1972 | DeFago et al. | 8/2.5 |
| 3,940,246 | 2/1976 | DeFago et al. | 8/2.5 |
| 4,047,230 | 1/1978 | Sandhu | 8/2.5 A |
| 4,081,277 | 3/1978 | Brault et al. | 96/38.2 |

*Primary Examiner*—Edward C. Kimlin
*Attorney, Agent, or Firm*—J. Jeffrey Hawley

[57] ABSTRACT

A color imaging device which comprises an adhesive layer between (a) means for sensing radiation comprising a planar array of charge-handling semiconductive photosensors, and (b) superimposed filter means for controlling access of radiation to the sensing means comprising a transparent polymer layer capable of receiving dyes such as heat transferable dyes; the adhesive layer comprising a polyester selected from the group consisting of (1) polyesters having recurring carboxylate units of which at least 80 mole percent are terephthalate units, and recurring alkylene units derived from glycols of which at least 40 mole percent are ether alkylene units, with the proviso that either (a) the recurring alkylene units comprise at least 60 mole percent ether alkylene units or (b) either the recurring carboxylate units comprise at least 2 mole percent pyromellitic tetracarboxylate units or at least 10 mole percent of linear aliphatic dicarboxylate units having at least 8 carbon atoms, and that when at least 10 mole percent of the carboxylate units are said linear aliphatic dicarboxylate units, the total of the mole percent of lower aliphatic dicarboxylate units of the recurring carboxylate units plus the mole percent of ether alkylene units of the recurring alkylene units is at least 60 mole percent and (2) polyesters having recurring alkylene units and recurring carboxylate units wherein at least 30 mole percent of the carboxylate units are alicyclic dicarboxylate units and wherein the remaining carboxylate units are nonlinear aromatic dicarboxylate units. A method for preparing such devices, color filter arrays useful therein and imaging elements useful therein are also described.

19 Claims, 1 Drawing Figure

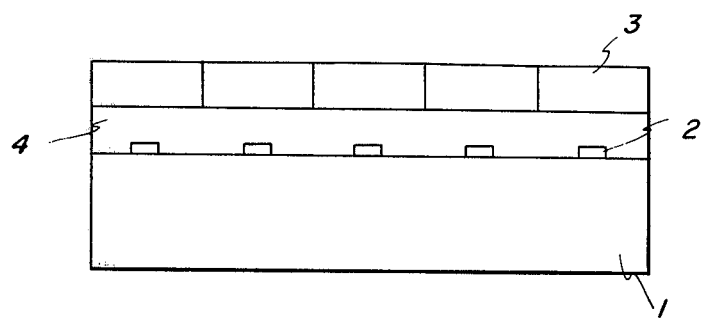

COLOR IMAGING DEVICES HAVING INTEGRAL COLOR FILTER ARRAYS

FIELD OF THE INVENTION

This invention relates to color filter arrays, imaging elements and color imaging devices having integral color filter arrays and particularly to the use of certain polymeric materials as adhesives between sensing areas of color imaging devices and dye accepting polymer layers that form the color filter arrays.

BACKGROUND OF THE INVENTION

A reliable, yet sensitive all-solid-state color video camera would find abundant utility including, for example, use in television, card readers, facsimile recorders, picturephones, and character recognition, etc.

Color photosensitive devices using charge-handling solid-state image sensors of various types, for example, charge-coupling devices, known as CCDs, and charge-coupling imagers known as CCIs, have been proposed for and used in video cameras. To avoid optical complexity and problems with image registration, it is highly desirable that color image sensing occur at a single imaging site, e.g., at a single planar photosensitive array. Difficulty is encountered with such "single-site" color imaging, however, because at least three distinct types of color information must be extracted in order to represent a color image in video signal form.

One known approach to providing a "single-site" color sensing device uses a single image sensor of broad wavelength sensitivity and a cooperating filter disc which passes a series of color filters through the image beam in a repeating sequence. The filter interpositions are synchronized to image scanning a filter typically being interposed during an entire field scan. Devices operating in this manner are said to produce a "field sequential" color signal. One problem with this approach is that the resulting signal presents the extracted color image information in a time order which is radically different from the time order of, for instance, the standard NTSC video signal. (The standard NTSC video signal is described in Chapter 16, "Television Transmission", of Transmission Systems For Communications, Revised Third Edition, by Members of the Technical Staff of Bell Telephone Laboratories, Copyright 1964, Bell Telephone Laboratories, Inc.) A further disadvantage is that some of the color image information (e.g., blue image information if a blue basic color is utilized) tends to be disproportionately detailed and hence wasteful of sensor capacity in consideration of the response characteristics of the human eye.

Certain other proposed approaches to achieving "single-site" color image sensing call for the use of striped color filters superimposed on a single image sensor. One such type of image sensor uses filter grids which are angularly superimposed on one another (see U.S. Pat. No. 3,378,633). As a result of image scanning, such image sensors produce a composite signal wherein chrominance information is represented in the form of modulated carrier signals. Such apparatus may be adapted to produce signals in the NTSC format or, if desired, the color image information can be separated by frequency domain techniques. In practice, however, it has proven difficult to produce such sensors economically, particularly where detailed image information is required.

Striped filters which transmit a repeating sequence of three or more spectral bands have also been proposed for use in color imaging. With this arrangement, the filters are typically aligned in one direction and scanning of the image is performed orthogonally to that direction. In effect, elemental sample areas are defined along the filter stripes. With this arrangement, it will be appreciated, sampling for a given color is not uniform for both directions. Additionally, the sampling patterns which result tend to provide a disproportionate quantity of information regarding basic color vectors to which the dye has less resolving power, e.g., "blue" information relative to "green" information.

Another approach to color imaging which has been proposed is the "dot" scanning system, as discussed in U.S. Pat. No. 2,683,769 to Banning. That approach generally uses spectrally selective sensor elements which are arranged in triads (red, green and blue elements, respectively). However, in U.S. Pat. No. 2,755,334, also to Banning, a repeated arrangement of four element groupings (red-, green-, blue-, and white-sensitive elements, respectively) is described. Such approaches to color imaging have not been of practical significance, in part because of the cost of fabricating the number of individual elements which are required to provide image information having adequate detail.

Many of the problems associated with the prior art discussed above are overcome by the approach taken in U.S. Pat. No. 3,971,065, issued July 20, 1976, in the name of B. E. Bayer. In the Bayer approach, color imaging is effected by a single imaging array composed of individual luminance and chrominance sensing elements that are distributed according to type (sensitivity) in repeating interlaid patterns, the luminance pattern exhibiting the highest frequency of occurrence—and therefore the highest frequency of image sampling—irrespective of direction across the array.

Preferably, to produce an element array according to the Bayer approach, a solid state sensor array of broad wavelength sensitivity is provided with a superposed filter array. Filters which are selectively transparent in the green region of the spectrum are preferably employed in producing luminance-type elements, and filters selectively transparent in the red and blue spectral regions, respectively, are preferably employed in producing chrominance-type elements. (The term "luminance" is herein used in a broad sense to refer to the color vector which is the major contributor of luminance information. The term "chrominance" refers to those color vectors other than the luminance color vectors which provide a basis for defining an image.)

Methods for providing multi-color filter arrays are known in the art. A particularly useful method is described in copending U.S. Patent application Ser. No. 730,886, filed Oct. 8, 1976 in the name of A. T. Brault, W. A. Light, and Thomas W. Martin and entitled "A Method for Making a Solid-State Color Imaging Device Having an Integral Color Filter and the Device", now U.S. Pat. No. 4,081,277. The Brault et al. application describes a method for making a solid-state color imaging device that comprises coating a layer of a dye-receiving polymer on a solid-state photosensitive device and diffusing heat-transferable dyes into the polymer to produce a multicolor filter on the photosensitive device.

We have found that during the processing necessary to produce the color imaging devices described by Brault et al. supra, the dye-receiving polymer does not adhere well to the solid-state photosensitive devices, particularly silicon-based devices, and may be scraped off. Therefore, it would be desirable to find a material to promote the adherence of the dye-receiving polymer to the solid-state photosensor.

SUMMARY OF THE INVENTION

We have discovered that certain polymeric materials are useful as adhesives in promoting the adherence of a color filter array comprising a dye-receiving polymer layer onto a solid-state photosensitive device. The polymeric layer capable of receiving a dye or dyes is processed to provide a multi-color filter array in micro-registration with the photosensitive areas of the underlying solid-state photosensitive device. Thus, the present invention provides an imaging element comprising a semiconductive, photosensitive base having coated thereon an adhesive polymeric layer comprising a polyester selected from the group consisting of (1) polyesters having recurring carboxylate units of which at least about 80 mole percent are terephthalate units, and recurring alkylene units derived from glycols of which at least about 40 mole percent are ether alkylene units, with the proviso that either (a) the recurring alkylene units comprise at least 60 mole percent ether alkylene units, or (b) the recurring carboxylate units comprise either at least 2 mole percent pyromellitictetracarboxylate units or at least 10 mole percent of linear aliphatic dicarboxylate units having at least 8 carbon atoms, with a further proviso that, when at least 10 mole percent of the carboxylate units are said linear aliphatic dicarboxylate units, the total of the mole percent of linear aliphatic dicarboxylate units of the carboxylate units plus the mole percent of ether alkylene units of the recurring alkylene units is at least 60, and (2) polyesters having recurring alkylene units and recurring carboxylate units, wherein at least 30 mole percent of the carboxylate units are alicyclic dicarboxylate units and with the remaining carboxylate units being nonlinear aromatic dicarboxylate units. The invention also provides for a color filter array comprising filter means comprising a plurality of radiation-intercepting means defining a planar array of filter elements, said filter element containing a transparent, polymeric layer capable of receiving a dye, wherein said filter array contains a layer comprising the adhesive described above.

A color imaging device is prepared by adhering the color filter array to the imaging element with the adhesive described above.

The drawing represents a color imaging device according to one embodiment of the invention.

DETAILED DESCRIPTION OF THE INVENTION

A color imaging device in accord with this invention comprises a solid-state photosensitive device and an integral multi-color filter array. The filter array preferably comprises a layer of a dye-receiving polymer having an array of individual, colored filter elements as described, for example, in Brault et al., U.S. Patent application Ser. No. 730,886, filed Oct. 8, 1976, now U.S. Pat. No. 4,081,277, and in Research Disclosure No. 15909, July, 1977. Typical solid-state photosensors useful in this invention are charge-handling image sensors, examples of which include, for instance, charge-coupled devices (also known as charge-coupled imagers, charge-transfer devices, charge-transfer imagers, etc.), charge injection devices, bucket brigade devices, diode arrays, combinations of these, and the like.

The filter elements are in micro-registration with, and along at least one dimension of, the radiation sensing area of the underlying photosensor or photosensors. As used herein, the term "micro-registration" means that the defined areas are preferably less than $10^{-4}$ square centimeter and have at least one dimension less than about 100 micrometers, for example, the filter areas and sensing areas described herein, are aligned so that, on a micrometer scale, the filter area and underlying sensing area or areas are substantially coextensive with each other, and the boundaries of such areas are substantially superimposed. Thus, a single filter element having at least one dimension less than about 100 micrometers may be superimposed over one sensing area or a group of sensing areas in accord with the particular embodiment of the invention.

An improved method for making a color imaging device comprises means for sensing radiation comprising a planar array of charge-handling semiconductive photosensors each defining a sensing area having at least one dimension that is less than about 100 micrometers, and filter means for controlling the access of radiation to said sensing means, said filter means comprising a plurality of radiation intercepting means defining a planar array of filter elements lying in micro-registration with the sensing area of said photosensors, said method comprising:

coating the photosensors with an adhesive polymer and superimposing on the array of adhesion coated photosensors the filter means such that filter elements of the intercepting means are in micro-registration with the underlying sensing area of the photosensors, the improvement wherein the adhesive polymer is a polyester selected from the group consisting of:

(1) polyesters having recurring carboxylate units of which at least 80 mole percent are terephthalate units, and recurring alkylene units derived from glycols of which at least 40 mole percent are ether alkylene units, with the proviso that either (a) the recurring alkylene units comprise at least 60 mole percent ether alkylene units or (b) either the recurring carboxylate units comprise at least 2 mole percent pyromellitictetracarboxylate units or at least 10 mole percent of linear aliphatic dicarboxylate units having at least 8 carbon atoms, and that when at least 10 mole percent of the carboxylate units are said linear aliphatic dicarboxylate units, the total of the mole percent of lower aliphatic dicarboxylate units of the recurring carboxylate units plus the mole percent of ether alkylene units of the recurring alkylene units is at least 60 and (2) polyesters having recurring alkylene units and recurring carboxylate units wherein at least 30 mole percent of the carboxylate units are alicyclic dicarboxylate units wherein the remaining carboxylate units are nonlinear aromatic dicarboxylate units.

Preferably, the filter means are formed by a method comprising:

A. coating a layer of photoresist over a transparent, polymeric layer capable of receiving dyes;

B. exposing the photoresist to a pattern representing a set of filter elements and developing the photoresist to obtain window areas in the photoresist layer corresponding to said pattern;

C. heating and diffusing heat-transferable dye into the dye-receiving layer through the window areas, thus forming dyed filter elements corresponding to said pattern; and D. removing the remaining portions of the photoresist to yield a first set of dyed filter elements in a planar array in the dye-receiving layer.

An example of a color imaging device is illustrated in the drawing, where a support 1 generally comprising an imaging wafer comprising a series of photosensors and having electrode structures 2 attached thereto is bonded to the color filter array 3, preferably containing sets of dyed filter elements by the adhesive 4 described above.

The filter means comprises sets of dyed filter elements, each set having common light absorption and transmission characteristics made by diffusing a heat-transferable dye into a transparent polymeric dye-receiving layer. The filter means comprises at least two different sets of light intercepting means. Advantageously, the filter elements of each set of light intercepting means contain a heat-transfer dye or dyes having radiation absorption and transmission in a different region of the spectrum from that of each other set.

We have found that the dye-receiving polymers do not, in general, adhere adequately to the solid-state photosensors, thus resulting in the dye-receiving polymer peeling or otherwise separating from the photosensor. We have now discovered that certain polyesters are useful in promoting the adherence of such dye-receiving polymers to the photosensors. Polyesters useful in accord with this invention can be selected from the group consisting of:

1. Polyesters having recurring carboxylate units at least about 80 mole percent of which are terephthalate units, the remainder being units derived from any aromatic or aliphatic dicarboxylate, anhydride, or dianhydride such as isophthalate, cyclohexane-1,4-dicarboxylate, hexatriacontane-1,36-dicarboxylate, pyromellitic-tetracarboxylate, cyclohexane-1,3-dicarboxylate, and the like, and recurring alkylene units derived from glycols at least 40, preferably at least 60 mole percent of which are ether alkylene units such as those derived from diethylene glycol, triethylene glycol, tetraethylene glycol, poly(ethylene glycols) and the like, the remainder being cyclohexylenedimethylene or any other alkylene group such as 2,2-dimethyl-1,3-propylene, trimethylene, tetramethylene, propylene, and the like, with the proviso that the recurring alkylene units must comprise at least 60 mole percent ether alkylene units, or the recurring carboxylate units must comprise either (1) at least 2 mole percent recurring pyromellitictetracarboxylate units or (2) at least 10 mole percent of linear aliphatic dicarboxylate units having at least about 8 carbon atoms such as 1,10-decanedicarboxylate units, 1,36-hexatriacontanedicarboxylate, and the like, so that the total mole percent of said linear aliphatic dicarboxylate units based on carboxylate components plus the mole percent of ether alkylene units based on recurring alkylene units is at least 60 mole percent; and 2. Polyesters having at least 30, preferably 100 mole percent recurring alicyclic dicarboxylate units, such as 1,3- and 1,4-cyclohexanedicarboxylate, 2,6-decalindicarboxylate, 1,5-decalindicarboxylate and the like and the remainder being nonlinear aromatic dicarboxylate units, i.e., isophthalate as opposed to terephthalate units, and 100 mole percent recurring alkylene units such as tetramethylene, decamethylene, and the like.

The polyester subbing materials of this invention preferably will have one of the following structures, A or B.

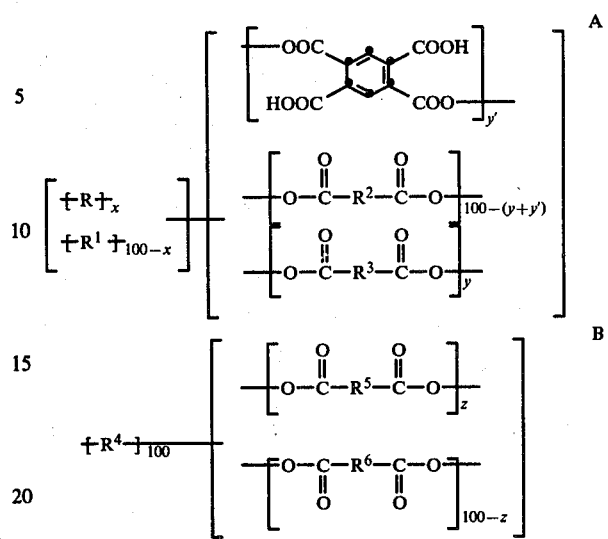

wherein each R is one or more recurring alkylene ether groups each preferably having the structure

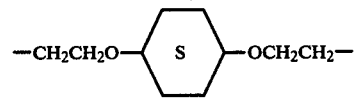

or $-(CH_2CH_2O)_nCH_2CH_2-$, wherein n is an integer of from 2 to 4, $R^1$ is a straight or branched chain alkylene group, preferably containing from 2 to 10 carbon atoms such as ethylene, propylene, trimethylene, tetramethylene, 2-butyl-2-ethyl-1,3-propylene and the like, $R^2$ is an aromatic group, preferably containing from 6 to 10 carbon atoms such as phenylene, $R^3$ is a linear aliphatic alkylene group having at least 8 carbon atoms, $R^4$ is an alkylene group of about 2 to 16 carbon atoms such as ethylene, hexylene and the like, $R^5$ is an alicyclic group having from 4 to 20 carbon atoms such as a cyclohexylene or 2,3-norbornylene, $R^6$ is a nonlinear aromatic group, preferably containing from 6 to 10 carbon atoms such as 1,3-phenylene, x, y, y' and z represent mole percents, x being 40 to 100 mole percent, y being 0 to 20 mole percent, y' being 0 to 20 mole percent, y+y' is equal to or less than 20 mole percent, and z being 30 to 100 mole percent with the proviso that x+y is at least 60 mole percent when y is greater than 0, y' is 0 when y is greater than 0; and y' is greater than 2 mole percent when y is 0 and x is less than 60 mole percent.

Examples of polyesters useful herein are poly(2,2'-oxydiethylene terephthalate); poly(1,4-tetramethylene cyclohexane-1,4'-dicarboxylate); poly[2,2'-oxydiethylene:3,6-dioxa-1,8-octylene (70:30) terephthalate]; poly[2,2-dimethyl-1,3-propylene:2,2'-oxydiethylene (50:50) hexatriacontane-1,36-dicarboxylate:terephthalate (10:90)]; poly[2,2-dimethyl-1,3-propylene:2,2'-oxydiethylene (50:50) pyromellitictetracarboxylate:hexatriacontane-1,36-dicarboxylate:terephathalate (2:10:88)]; poly[1,10-decamethylenecyclohexane-1,3-dicarboxylate:isophthalate (30:70)]; poly[2,2-dimethyl-1,3-propylene:2,2'-oxydiethylene (50:50) pyromellitictetracarboxylate:terephthalate (2:98)]; poly[2,2'-oxdiethylene:3,6-dioxa-1,8-octylene (70:30) pyromellitictetracarboxylate:terephthalate (2:98)]; and poly[2,2- dimethyl-1,3-propylene pyromellitictetracarboxylate:-terephthalate (2:98)], and the like.

The above polyesters are very useful as adhesive or sub layers for promoting the adherance of other polymer layers to the surface (preferably silicon dioxide) of semiconductive devices. These adhesive or sub layers can be applied by any of a variety of known coating techniques but, in the electronics industry, are most commonly applied by spin coating techniques. It is desired to have a thin, continuous coating of the adhesive polyester. Thus, the thickness of the dried layer is generally less than one micrometer, and on the order of 100 to 300 Angstroms, although the thickness of such layers is not critical.

The particular polyester adhesion promoting polymer described above will promote the adhesion of a wide variety of polymeric layers capable of receiving dyes to the surface of semiconductive devices. The adhesive promoting polyesters are particularly useful for promoting the adherence of polyester dye-receiving layers and silicon dioxide surfaces. Such polyester dye-receiving layers can be selected from a class of amorphous, solvent soluble, aromatic polyesters comprising recurring units derived from the condensation residue of diol and carbonic acid or dicarboxylic acid, at least 30 mole percent of the recurring units containing a saturated gem-bivalent radical having a saturated polycyclic three-dimensional structure that includes a saturated bicyclic atomic bridge hydrogen ring member.

These polyesters have recurring units comprised of the condensation residue of aromatic diol having the general formula:

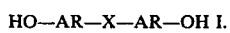

HO—AR—X—AR—OH I.

and/or the condensation residue of aromatic dicarboxylic acid having the general formula:

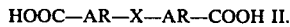

HOOC—AR—X—AR—COOH II.

wherein AR is an aromatic radical and X is a saturated gem-bivalent radical having a saturated polycyclic three-dimensional structure that includes a saturated bicyclic atomic bridged hydrocarbon ring member.

Typical of some three-dimensional polycyclic structures that provide a gem-bivalent radical is the norbornane ring. The conventional method of drawing this ring is as follows:

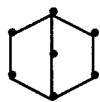

An approximate representation which shows the three-dimensional nature of the ring is as follows:

Within the gem-bivalent connecting radical, the single carbon atom to which, for example, the two phenyl nuclei of an aromatic diol or dicarboxylic acid are connected may be a carbon within the polycyclic structure, or it may be a

group attached to the polycyclic structure. For example, in 4,4'-(2-norbornylidene)diphenol, the phenolic groups are attached directly to a carbon atom within the polycyclic structure:

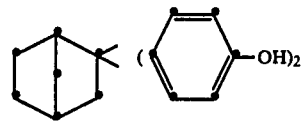

In 4,4'-(2-norbornylmethylene)diphenol, a methylidyne group attached to the polycyclic structure carries the phenolic groups:

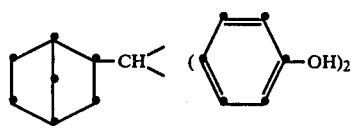

There may be additional saturated rings in the polycyclic structure in addition to the bicyclic member which contains the atomic bridge. These may be joined by fused or spiro-union linkage in the polycyclic structure. Atomic bridges may also occur in the additional member rings of the polycyclic structure. There may be alkyl, halogen, or aromatic substituents in the linking radical.

The atomic bridge within the polycyclic structure may have more than one carbon atom, e.g., (bicyclo[2.2.2]-octane)

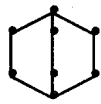

There may be more than one bridge in the polycyclic structure: e.g. (tricyclo[2.2.1.0$^{2,6}$]heptane)

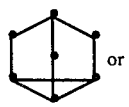 or (adamantane)

The atomic bridge may consist of an oxygen or nitrogen atom instead of carbon: e.g. (7-oxabicyclo[2.2.1]-heptane)

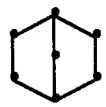

There may be alkyl, aryl and halide substituents on the polycyclic structure: e.g. (substituted norbornane)

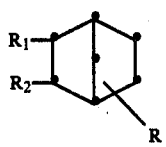

R, $R_1$ and $R_2$=H, halogen, alkyl ($C_1$-$C_4$), and aryl. Also, two substituents may be attached to the same carbon atom. Of course all of these substituents must be in positions which do not interfere with formation of the diol or dicarboxylic acid. For example, because of steric effects, certain bis-phenols cannot be obtained, e.g., those from some norbornane derivatives with two alkyl or halogen substituents in the 3 or 7 positions.

Additional saturated rings may be fused to the bicyclic bridged ring member in the polycyclic structure. These may be hydrocarbon or heterocyclic rings, e.g.,
  (hexahydro-4,7-methanoindane)

(octahydro-4,7-methanoisobenzofurane)

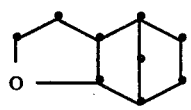

There may be additional bridges in the fused rings, e.g.,
  (decahydro-1,4,5,8-dimethanonaphthalene)

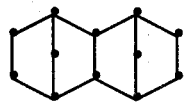

or
  (dodecahydro-4,9,5,8-dimethano-1-cyclopenta(b-)naphthalene)

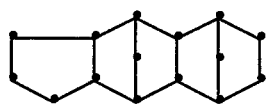

Additional saturated rings may be joined in the polycyclic structure by spiro-union linkage, e.g.
  (spiro[cyclopropane-1,7'-norbornane])

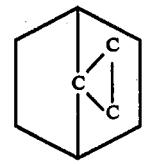

Any aromatic radical can be used in the diols and dicarboxylic acids described by the generic formula I or II above as long as they do not cause steric interference with their formation. Thus both substituted and unsubstituted aromatic radicals are useful. A particularly useful aromatic radical is the phenyl radical which preferably has the following formula:

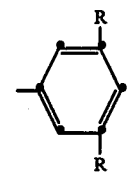

wherein each R is selected independently from hydrogen, halogen, or alkyl groups, preferably having from 1 to about 4 carbon atoms. Additional saturated or unsaturated rings may be fused to the benzene ring and the functional hydroxy or carboxy group can be attached at any convenient position.

When at least 30 percent of the recurring units of a polyester useful as a polymeric mordant in this invention contain the condensation residue of carbonic acid or dicarboxylic acid and a diol comprising a saturated gem-bivalent linking radical X as defined above, the remaining recurring units preferably are derived from carbonic acid or dicarboxylic acid and diol that comprises bisphenol having the following structure:

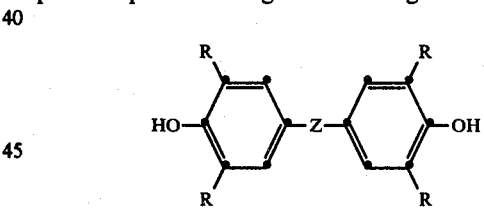

wherein R is the same as defined above and Z is selected from a sulfonyl group; an alkylidene group, preferably isopropylidene; or a cycloalkylidene group such as, for example, cyclopentylidene, cyclohexylidene, 2-norbornylidene, 9-fluorenylidene, 2(5H)-benzo[c]furanon-5-ylidene, and the like.

In other preferred polyesters, when the diol comprises an aromatic group containing the gem-bivalent connecting radical X as described above, at least about 30 mole percent of the acid component is terephthalic acid, isophthalic acid, or a mixture thereof. The remainder of the acid component, up to 70 mole percent, is selected from carbonic acid or other dicarboxylic acids. Preferred such dicarboxylic acids are, for example, 4,4'-sulfonylbisbenzoate; 1,2,3,4-tetrahydro-2,6-naphthalenedicarboxylate; 4,4'-isopropylidenebisbenzoate; 2,6-naphthalenedicarboxylate; and 1,1,3-trimethyl-3-phenylindan-5,4'-dicarboxylate.

The use of these polymers in making color imaging devices is fully described in the aforementioned Brault et al. patent application which is hereby incorporated by reference.

The polyesters described herein have been prepared from readily available commercial monomers by melt polycondensation techniques.

In the preparations and examples that follow:

1. All inherent viscosities (i.v.) were measured in a mixture of phenol:chlorobenzene, 50:50 (wt%), at a concentration of 0.25 g/100 ml at 25° C.

2. The thermal measurements were made by differential thermal analysis (DTA) with a duPont 900 apparatus at a heating rate of 10° C./min, with midpoint of the specific heat internal taken as the glass transition temperature ($T_g$).

The following preparations illustrate the procedure for preparing polyester adhesive materials in accordance with this invention:

Preparation 1—Poly(2,2'-oxydiethylene Terephthalate)

A mixture of dimethyl terephthalate (971.0 g, 5.0 mole), 2,2'-oxydiethylene glycol (912.0 g, 8.6 mole) and tetra-isopropylorthotitanate (20 drops, ~0.2 g) was heated with stirring under a blanket of nitrogen at 210° C. for 2 hours and at 240° C. for 3 hours until the evolution of methanol ceased. The polymerization was affected at 290° C./0.10–0.18 mm Hg for 1 hour to give a very viscous reaction mixture. The reaction mixture on coating under nitrogen yielded an amorphous polymer; i.v., dl/g=0.57; $T_g$, °C.=24.

Preparation 2—Poly(1,4-Tetramethylene cyclohexane-1,4'-dicarboxylate)

A mixture of dimethylcyclohexane-1,4-carboxylate (200.0 g, 1.0 mole) and 1,4-butanediol (112.0 g, 1.25 mole) in the presence of zinc acetate dihydrate (40 mg) and antimony trioxide (20 mg) was stirred under a slow stream of nitrogen at 200° C. for 2 hours; at 240° C. for 2 hours and finally at 260° C. for 1 hour until methanol ceased to evolve. The polymerization reaction at 270° C./0.25 mm Hg for 1.5 hour afforded a water white amorphous polymer of i.v., dl/g=0.61; $T_g$, °C.=−10.

Preparation 3-Poly[2,2'-Oxydiethylene:3,6-dioxa-1,8-octylene (70:30) Terephthalate]

A mixture of dimethyl terephthalate (194.2 g, 1.0 mole), diethylene glycol (111.4 g, 1.05 mole) and triethylene glycol (67.6 g, 0.45 mole) in the presence of zinc acetate dihydrate (60 mg) and antimony trioxide (20 mg) was heated as in the Example 3. The polymerization at 270° C./0.2 mm Hg for 3 hours gave an amorphous polymer; i.v., dl/g=0.60; $T_g$, °C.=9.

A series of copolyesters used for evaluation as subbing material prepared by the general polycondensation procedures as described above, are listed as Preparations 4 through 11 below with i.v.'s and Tg's. Comparative adhesives 12 and 13 are conventional subbing materials (see U.S. Pat. Nos. 3,437,444; 3,271,345; and 3,143,421).

Preparation 4—Poly[2,2-Dimethyl-1,3-propylene:2,2'-oxydiethylene (50:50) Hexatriacontane-1,36-dicarboxylate:terephthalate (10:90)]

i.v., dl/g=0.66; $T_g$, °C.=11

Preparation 5—Poly[2,2-Dimethyl-1,3-propylene:2,2'-oxydiethylene (50:50) Pyromellitictetracarboxylate:hexatriacontane-1,36-dicarboxylate:terephthalate (2:10:88)]

i.v., dl/g=0.61; $T_g$, °C.=20

Preparation 6—Poly[1,10-decamethylenecyclohexane-1,3-dicarboxylate isophthalate (30:70)]

i.v., dl/g=0.7; $T_g$, °C.=−24

Preparation 7—Poly[2,2-dimethyl-1,3propylene:2,2'-oxydiethylene (50:50) pyromellitictetracarboxylate:terephahalate (2:98)]

i.v., dl/g=0.35; $T_g$, °C.=79

Preparation 8—Poly[2,2'-oxydiethylene:3,6-dioxa-1,8-octylene (70:30) pyromellitictetracarboxylate:terephthalate (2:98)]

i.v., dl/g=0.86; $T_g$, °C.=16

Preparation 9—Poly[2,2-dimethyl-1,3propylene pyromellitictetracarboxylate:terephahalate (2:98)]

i.v., dl/g=0.45; $T_g$, °C.=55

The following preparations illustrate polyester materials made for comparison and which are not within the scope of this invention.

Preparation 10—Poly(2,2-Dimethyl-1,3-propylene terephthalate)

A mixture of dimethyl terephahalate (194.2 g, 1.0 mole), 2,2-dimethyl-1,3-propanediol (141.6 g, 1.36 mole) zinc acetate dihydrate (40 mg) and antimony trioxide (20 mg) was heated under the conditions as described in the previous experiment. The polymerization at 285° C./0.1 mm Hg for 1 hour gave a water white amorphous polymer; i.v., dl/g 0.54; $T_g$, °C.=75.

Preparation 11—Poly 2,2-dimethyl-1,3-propylene:2,2'-oxydiethylene (50:50) Terephthalate i.v., dl/g=0.66; $T_g$, °C.=45

Preparation 12—Poly[methyl acrylate-co-vinylidene chloride-coitaconic Acid](Weight ratio 14.7:83.3:2)

Preparation 13—Poly(acrylonitrile-co-vinylidene chloridide-coacrylic Acid) (Weight ratio 14.1:79.9:6)

The following solutions are used in the examples which follow:

(a) Poly[4,4'-(hexahydro-4,7-methanoindan-5-ylidene) diphenylene terephthalate], 5 g, was dissolved in a mixture of 10 ml dichloromethane and 35 ml toluene.

(b) 16 g KOPR-TOP photoresist was mixed with 2 g KOPR-TOP sensitizer (photoresist and sensitizer are manufactured by Chemco Photoproducts of Glen Cove, N.Y.)

EXAMPLE 1

A silicon wafer with a surface layer of silicon dioxide (1000 Å thick) was spin coated with a subbing solution prepared by dissolving 2.0 g of the polymer of Preparation 5 in a mixture of 20 ml dichloromethane and 20 ml 1,1,2-trichloroethane at 3000 rpm for 50 sec.

The wafer was then spin coated with (a) at 3000 rpm for 50 sec and was dried at 210°-220° C. in a drying oven for 2-3 hours.

Next, the wafer was spin coated with (b) at 1000 rpm for 50 sec and was air dried. The wafer was exposed with a Hg vapor lamp through a mask and the photoresist developed by immersing the wafer in $H_2O$ for 30-60 sec. The wafer was dried at 210°-220° C. for 30 min and then immersed in a 3 M $CaCl_2$ solution maintained at 80°-90° C. for 30 min.

After rinsing and squeegeeing with a rubber doctor blade to remove the photoresist, there was no evidence that the mordant coating had separated from the wafer surface.

EXAMPLE 2

Example 1 was repeated except 2.0 g of the polymer of Preparation 2 dissolved in 40 ml dichloromethane was used as the subbing solution.

Again, there was no evidence that the mordant coating did not adhere to the wafer surface.

EXAMPLE 3 (COMPARATIVE EXAMPLE)

Example 1 was repeated except 1.0 g of the polymer of Preparation 10 dissolved in a mixture of 10 ml dichloromethane and 10 ml 1,1,2-trichloroethane was used as the subbing solution.

The mordant coating did not adhere to the wafer surface after squeegeeing.

EXAMPLE 4

Example 1 was repeated except 0.8 g of the polymer of Preparation 3 dissolved in 16 ml dichloromethane was used as the subbing solution. There was no evidence that the mordant coating did not adhere to the wafer surface.

EXAMPLE 5

Example 1 was repeated except 0.4 g of the polymer of Preparation 1 dissolved in 12 ml dichloromethane was used as the subbing solution. There was no evidence that the mordant coating did not adhere to the wafer surface.

EXAMPLE 6

Example 1 was repeated except 1.0 g of the polymer of Preparation 4 dissolved in 20 ml dichloromethane was used as the subbing solution. There was no evidence that the mordant coating did not adhere to the wafer surface.

EXAMPLE 7

Example 1 was repeated except 0.5 g of the polymer of Preparation 6 dissolved in 10 ml dichloromethane was used as the subbing solution. There was no evidence that the mordant coating did not adhere to the wafer surface.

EXAMPLE 8

Example 1 was repeated except using the polymer of Preparation 8 as the subbing material. Results similar to those of Example 1 were obtained.

EXAMPLE 9

Example 1 was repeated except no subbing solution was used. The mordant coating peeled away from the wafer surface during the treatment in the 3 M $CaCl_2$ solution.

Note that Example 3 is a comparative example illustrating inoperability of a polymer outside the scope of this invention. Similarly the polymers of Preparations 11, 12 and 13 in comparative tests allowed the mordant coating to peel from the wafer during treatment in the $CaCl_2$ solution.

The invention has been described in detail with particular reference to certain preferred embodiments thereof, but it will be understood that variations and modifications can be effected within the spirit and scope of the invention.

We claim:

1. A color imaging device comprising a planar array of charge-handling semiconductor photosensors having sensing areas sensitive to radiant energy, said sensing areas having coated thereon an adhesive polymeric layer comprising a polyester selected from the group consisting of:
   (1) polyesters having recurring carboxylate units of which at least 80 mole percent are terephthalate units, and recurring alkylene units derived from glycols of which at least 40 mole percent are ether alkylene units, with the proviso that either (a) the recurring alkylene units comprise at least 60 mole percent ether alkylene units or (b) either the recurring carboxylate units comprise at least 2 mole percent pyromelliticetetracarboxylate units or at least 10 mole percent of linear aliphatic dicarboxylate units having at least 8 carbon atoms, and that when at least 10 mole percent of the carboxylate units are said linear aliphatic dicarboxylate units, the total of the mole percent of lower aliphatic dicarboxylate units of the recurring carboxylate units plus the mole percent of ether alkylene units of the recurring alkylene units is at least 60 and
   (2) polyesters having recurring alkylene units and recurring carboxylate units wherein at least 30 mole percent of the carboxylate units are alicyclic dicarboxylate units and wherein the remaining carboxylate units are nonlinear aromatic dicarboxylate units;

and superimposed on said adhesive polymeric layer, filter means comprising a plurality of radiation intercepting means defining a planar array of filter elements lying in micro-registration with, and along at least one dimension of, the sensing areas of said photosensors and containing a transparent, polymeric layer capable of receiving a dye.

2. The device of claim 1 wherein said filter means comprises a dye in said transparent polymeric layer.

3. The device of claim 1 wherein the adhesive polymeric layer comprises a polyester having a formula selected from the group consisting of

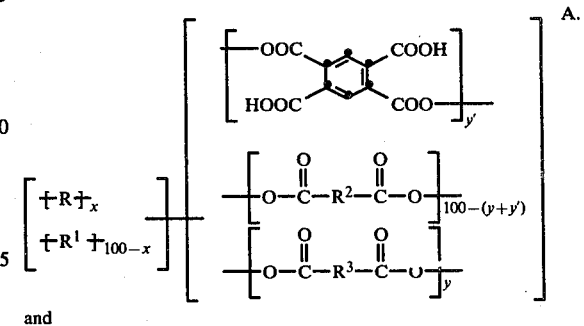

and

-continued $$B. \quad \left[ \begin{array}{c} -\!\!\left[\!O\!-\!\!\overset{O}{\underset{\|}{C}}\!-\!R^5\!-\!\!\overset{O}{\underset{\|}{C}}\!-\!O\!\right]_z\!- \\ -\!\!\left[\!O\!-\!\!\overset{}{\underset{O}{C}}\!-\!R^6\!-\!\!\overset{}{\underset{O}{C}}\!-\!O\!\right]_{100-z}\!- \end{array} \right]$$

$\left[\!+\!R^4\!\!+\!\overline{100}\!\right]\!-$ wherein R is one or more recurring alkylene ether groups; R' is a straight or branced chain alkylene group; $R^2$ is an aromatic group; $R^3$ is a linear aliphatic alkylene group having at least 8 carbon atoms; $R^4$ is an alkylene group containing from about 2 to about 16 carbon atoms; $R^5$ is an alicyclic group; $R^6$ is a nonlinear aromatic group; x is 40 to 100 mole percent, y is 0 to 20 mole percent, y' is 0 to 20 mole percent, y+y' is equal to or less than 20 mole percent and z is 30 to 100 mole percent, wherein x+y is at least 60 mole percent when y is greater than 0, y' is 0 when y is greater than 0, and y' is greater than 2 mole percent when y is 0 and x is less than 60 mole percent.

4. The device of claim 3 wherein said filter means comprises a dye in said transparent polymeric layer.

5. The device of claim 2 wherein the adhesive polymer is poly[2,2'-oxydiethylene:3,6-dioxa-1,8-octylene (70:30) pyromellitictetracarboxylate:terephthalate (2:98)].

6. A color imaging device comprising a planar array of charge-handling semiconductive photosensors having sensing areas sensitive to radiant energy, said sensing areas having coated thereon an adhesive polymeric layer comprising a polyester selected from the group consisting of:
   (1) polyesters having recurring carboxylate units of which at least 80 mole percent are terephthalate units, and recurring alkylene units derived from glycols of which at least 40 mole percent are ether alkylene units, with the proviso that either (a) the recurring alkylene units comprise at least 60 mole percent ether alkylene units or (b) either the recurring carboxylate units comprise at least 2 mole percent pyromellitictetracarboxylate units or at least 10 mole percent of linear aliphatic dicarboxylate units having at least 8 carbon atoms, and that when at least 10 mole percent of the carboxylate units are said linear aliphatic dicarboxylate units, the total of the mole percent of lower aliphatic dicarboxylate units of the recurring carboxylate units plus the mole percent of ether alkylene units of the recurring alkylene units is at least 60 and
   (2) polyesters having recurring alkylene units and recurring carboxylate units wherein at least 30 mole percent of the carboxylate units are alicyclic dicarboxylate units and wherein the remaining carboxylate units are nonlinear aromatic dicarboxylate units;
and superimposed on said adhesive polymeric layer, filter means comprising a plurality of radiation intercepting means defining a planar array of filter elements lying in microregistration with the sensing areas of said photosensors; said filter means having at least two sets of intercepting means, one set having a common radiation absorption and transmission characteristic that is different from another set; and adhered to the adhesive layer a polymeric layer capable of receiving a dye.

7. The device of claim 6 wherein the dye-receiving layer is poly[4,4'-(hexahydro-4,7-methanoindan-5-ylidene)-diphenylene terephthalate].

8. The device of claim 6 wherein the photosensors are at the surface of a silicon wafer.

9. The device of claim 8 wherein the silicon wafer has a surface of $SiO_2$.

10. The device of claim 6 wherein the layer capable of receiving a dye contains an interlaid pattern of dyes which absorb radiation in at least one portion of the spectrum and transmit radiation in at least one other portion of the spectrum.

11. The device of claim 6 wherein the adhesive polymeric layer comprises a polyester having a formula selected from the group consisting of $$A. \quad \left[\!\left[\!+\!R\!+_x \atop +R^1\!+_{100-x}\!\right]\!-\!\left[\begin{array}{c}\!+\!OOC\!-\!\!\!\underset{HOOC}{\diagdown}\!\!\!\!\underset{\phantom{x}}{\bigcirc}\!\!\!\!\underset{\phantom{x}}{\diagup}\!\!\!COOH \\ \phantom{+OOC}\diagdown COO\!-\!\!\!\right]_{y'} \\ -\!\left[\!O\!-\!\overset{O}{\underset{\|}{C}}\!-\!R^2\!-\!\overset{O}{\underset{\|}{C}}\!-\!O\!\right]_{100-(y+y')} \\ -\!\left[\!O\!-\!\overset{O}{\underset{\|}{C}}\!-\!R^3\!-\!\overset{O}{\underset{\|}{C}}\!-\!O\!\right]_{y} \end{array}\right]\right]$$

and $$B. \quad \left[\!+\!R^4\!+_{\overline{100}}\!\right]\!-\!\left[\begin{array}{c}-\!\left[\!O\!-\!\overset{O}{\underset{\|}{C}}\!-\!R^5\!-\!\overset{O}{\underset{\|}{C}}\!-\!O\!\right]_z \\ -\!\left[\!O\!-\!\underset{O}{\overset{}{C}}\!-\!R^6\!-\!\underset{O}{\overset{}{C}}\!-\!O\!\right]_{100-z}\end{array}\right]$$

wherein R is one or more recurring alkylene ether groups; R' is a straight or branched chain alkylene group; $R^2$ is an aromatic group; $R^3$ is a linear aliphatic alkylene group having at least 8 carbon atoms; $R^4$ is an alkylene group containing from about 2 to about 16 carbon atoms; $R^5$ is an alicyclic group; $R^6$ is a nonlinear aromatic group; x is 40 to 100 mole percent, y is 0 to 20 mole percent, y' is 0 to 20 mole percent, y+y' is equal to or less than 20 mole percent and z is 30 to 100 mole percent, wherein x+y is at least 60 mole percent when y is greater than 0, y' is 0 when y is greater than 0, and y' is greater than 2 mole percent when y is 0 and x is less than 60 mole percent.

12. The device of claim 10 wherein said filter means comprises three sets of radiation intercepting means, the filter elements of all intercepting means of each set selectively transmitting light of a different primary color.

13. The device of claim 12 wherein at least some of said photosensors have sensing areas, at least one dimension of which is less than about 100 micrometers.

14. The device of claim 12 wherein at least some of said photosensors have a radiation sensing area less than about $10^{-4}$ square centimeters.

15. In a color imaging device comprising:
   A. means for sensing radiation comprising a planar array of charge-handling semiconductive photosensors, at least some of said photosensors having a radiation sensing area, at least one dimension of which is less than about 100 micrometers, and superimposed thereon,
B. filter means for controlling access of radiation to said sensing means, said filter means comprising
1. a transparent, polymeric layer capable of receiving a heat-transferable dye and
2. a plurality of radiation intercepting means defining a planar array of filter elements lying in said receiving layer in micro-registration with the sensing areas of said photosensors, the filter area of said intercepting means comprising a dye that absorbs radiation in at least one portion of the spectrum and transmits radiation in at least one other portion of the spectrum,
said filter means having at least two sets of intercepting means, one set having a common radiation absorption and transmission characteristic that is different from another set, the improvement which comprises an adhesive layer between the means for sensing radiation and the filter means, said adhesive layer comprising a polyester selected from the group consisting of:
(1) polyesters having recurring carboxylate units of which at least 80 mole percent are terephthalate units, and recurring alkylene units derived from glycols of which at least 40 mole percent are ether alkylene units, with the proviso that either (a) the recurring alkylene units comprise at least 60 mole percent ether alkylene units or (b) either the recurring carboxylate units comprise at least 2 mole percent pyromellitictetracarboxylate units or at least 10 mole percent of linear aliphatic dicarboxylate units having at least 8 carbon atoms, and that when at least 10 mole percent of the carboxylate units are said linear aliphatic dicarboxylate units, the total of the mole percent of lower aliphatic dicarboxylate units of the recurring carboxylate units plus the mole percent of ether alkylene units of the recurring alkylene units is at least 60 and
(2) polyesters having recurring alkylene units and recurring carboxylate units wherein at least 30 mole percent of the carboxylate units are alicyclic dicarboxylate units and wherein the remaining carboxylate units are nonlinear aromatic dicarboxylate units.

16. In a color imaging device comprising:
A. means for sensing radiation comprising a planar array of charge-handling semiconductive photosensors, at least some of which have a radiation sensing area less than $10^{-4}$ square centimeters; and superimposed thereon,
B. filter means for controlling access of radiation to said sensing means, said filter means comprising
1. a transparent, polymeric layer capable of receiving a heat-transferable dye and
2. a plurality of radiation intercepting means defining a planar array of filter elements lying in said receiving layer in micro-registration with the sensing areas of said photosensors, the filter area of said intercepting means comprising at least one dye that absorbs radiation in at least one portion of the spectrum and transmits radiation in at least one other portion of the spectrum,
said filter means comprising three sets of said intercepting means, one set having filter elements that selectively transmit green light, a second set having filter elements that selectively transmit red light, and a third set having filter elements that selectively transmit blue light, the improvement which comprises an adhesive layer between the means for sensing radiation and the filter means, said adhesive layer comprising a polyester having a formula selected from the group consisting of:

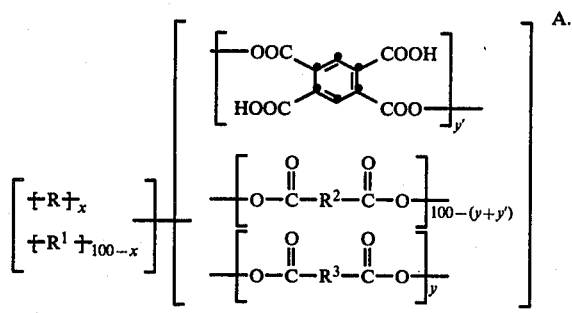

and

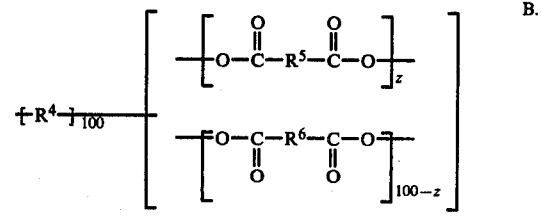

wherein R is one or more recurring alkylene ether groups; R' is a straight or branched chain alkylene group; $R^2$ is an aromatic group; $R^3$ is a linear aliphatic alkylene group having at least 8 carbon atoms; $R^4$ is an alkylene group containing from about 2 to about 16 carbon atoms; $R^5$ is an alicyclic group; $R^6$ is a nonlinear aromatic group; x is 40 to 100 mole percent, y is 0 to 20 mole percent, y' is 0 to 20 mole percent, y+y' is equal to or less than 20 mole percent and z is 30 to 100 mole percent wherein x+y is at least 60 mole percent when y is greater than 0, y' is 0 when y is greater than 0, and y' is greater than 2 mole percent when y is 0 and x is less than 60 mole percent.

17. In a color imaging device comprising:
A. means for sensing radiation comprising a planar array of charge-handling semiconductive photosensors, at least some of which have a visible radiation sensing area less than $10^{-4}$ square centimeter; and superimposed thereon,
B. filter means for controlling access of radiation to said sensing means, said filter means comprising
1. a transparent, polymeric dye-receiving layer capable of receiving a heat-transferable dye and
2. a plurality of light inercepting means defining a planar array of filter elements lying in said receiving layer in micro-registration with the sensing areas of said photosensors, the filter area of said intercepting means comprising at least one dye that absorbs radiation in at least one portion of the spectrum and transmits radiation in at least one other portion of the spectrum,
3. a first set of said light intercepting means having a common light absorption and transmission characteristic wherein light is absorbed in one portion of the visible spectrum and transmitted in another portion of the visible spectrum, and
4. a second set of light intercepting means having a common light absorption and transmission characteristic which differs from that of said first set of light intercepting means, said first and second set of light intercepting means forming an interlaid pattern, the improvement which comprises an adhesive layer between the means for sensing radiation and the filter means, said adhesive layer comprising a polyester selected from the group consisting of:

(1) polyesters having recurring carboxylate units of which at least 80 mole percent are terephthalate units, and recurring alkylene units derived from glycols of which at least 40 mole percent are ether alkylene units, with the proviso that either (a) the recurring alkylene units comprise at least 60 mole percent ether alkylene units or (b) either the recurring carboxylate units comprise at least 2 mole percent pyromellitictetracarboxylate units or at least 10 mole percent of linear aliphatic dicarboxylate units having at least 8 carbon atoms, and that when at least 10 mole percent of the carboxylate units are said linear aliphatic dicarboxylate units, the total of the mole percent of lower aliphatic dicarboxylate units of the recurring carboxylate units plus the mole percent of ether alkylene units of the recurring alkylene units is at least 60 and (2) polyesters having recurring alkylene units and recurring carboxylate units wherein at least 30 mole percent of the carboxylate units are alicyclic dicarboxylate units and wherein the remaining carboxylate units are nonlinear aromatic dicarboxylate units.

18. In a color imaging device comprising:

A. means for sensing radiation comprising a planar array of charge-handling semiconductive photosensors, at least some of which have a visible radiation sensing area less than $10^{-4}$ square centimeters; and superimposed thereon, B. filter means for controlling access of radiation to said sensing means, said filter means comprising
1. a transparent, polymeric layer capable of receiving a dye and
2. a plurality of light intercepting means defining a planar array of filter elements lying in said receiving layer in micro-registration with the sensing areas of said photosensors, the filter area of said intercepting means comprising at least one dye that absorbs radiation in at least one portion of the spectrum and transmits radiation in at least one other portion of the spectrum,
3. a first set of said light intercepting means having a common light absorption and transmission characteristic wherein light is absorbed in one portion of the visible spectrum and transmitted in another portion of the visible spectrum,
4. a second set of light intercepting means having a common light absorption and transmission characteristic which differs from that of said first set of light intercepting means,
5. a third set of light intercepting means having a common light absorption and transmission characteristic which differs from that of both the first and the second set of light intercepting means, said first, second and third sets of light intercepting means forming an interlaid pattern, the improvement comprising an adhesive layer between the means for sensing radiation and the filter means, said adhesive layer comprising a polyester having a formula selected from the group consisting of:

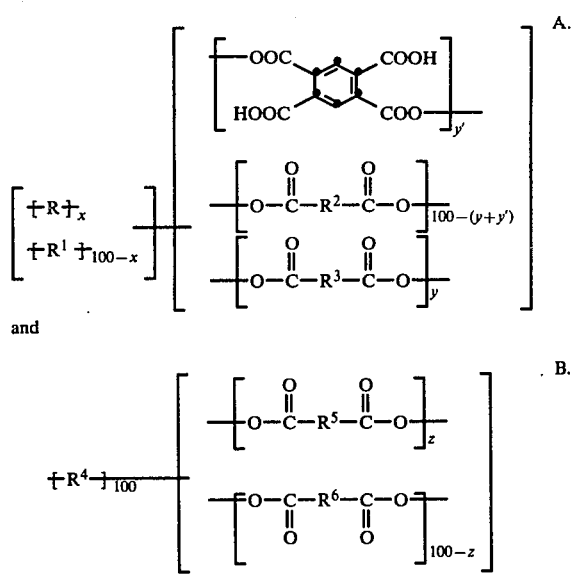

wherein R is one or more recurring alkylene ether groups; R' is a straight or branched chain alkylene group; $R^2$ is an aromatic group; $R^3$ is a linear aliphatic alkylene group having at least 8 carbon atoms; $R^4$ is an alkylene group containing from about 2 to about 16 carbon atoms; $R^5$ is an alicyclic group; $R^6$ is a nonlinear aromatic group; x is 40 to 100 mole percent, y is 0 to 20 mole percent, y' is 0 to 20 mole percent, y+y' is equal to or less than 20 mole percent and z is 30 to 100 mole percent wherein x+y is at least 60 mole percent when y is greater than 0, y' is 0 when y is greater than 0, and y' is greater than 2 mole percent when y is 0 and x is less than 60 mole percent.

19. In a color imaging device comprising:

A. means for sensing radiation comprising a planar array of charge-handling semiconductive photosensors at least some of said photosensors having a radiation sensing area, said sensing area having at least one dimension less than about 100 micrometers, and superimposed thereon, B. filter means for controlling access of radiation to said sensing means, said filter means comprising
1. a transparent, polymeric layer, said layer comprising an aromatic polyester having recurring units derived from diol and carbonic acid or dicarboxylic acid, at least 30 mole percent of the recurring units containing a saturated gem-bivalent radical having a saturated polycyclic three-dimensional structure that includes a saturated bicyclic atomic bridge hydrocarbon ring member, and
2. a plurality of radiation intercepting means defining a planar array of filter elements lying in said receiving layer in micro-registration with the sensing areas of said photosensors, the filter area of said intercepting means comprising at least one heat-transferable dye that absorbs radiation in at least one portion of the spectrum and transmits radiation in at least one other portion of the spectrum, said filter means having at least two sets of intercepting means, one set having a common radiation absorption and transmission characteristic that is different from another set, the improvement comprising an adhesive layer between the means for sensing radiation and the filter means, said adhesive layer comprising a polyester selected from the group consisting of:

(1) polyesters having recurring carboxylate units of which at least 80 mole percent are terephthalate units, and recurring alkylene units derived from glycols of which at least 40 mole percent are ether alkylene units, with the proviso that either (a) the recurring alkylene units comprise at least 60 mole percent ether alkylene units or (b) either the recurring carboxylate units comprise at least 2 mole percent pyromellitictetracarboxylate units or at least 10 mole percent of linear aliphatic dicarboxylate units having at least 8 carbon atoms, and that when at least 10 mole percent of the carboxylate units are said linear aliphatic dicarboxylate units, the total of the mole percent of lower aliphatic dicarboxylate units of the recurring carboxylate units plus the mole percent of ether alkylene units of the recurring alkylene units is at least 60 and (2) polyesters having recurring alkylene units and recurring carboxylate units wherein at least 30 mole percent of the carboxylate units are alicyclic dicarboxylate units and wherein the remaining carboxylate units are nonlinear aromatic dicarboxylate units.

* * * * *